(12) United States Patent
Kurano

(10) Patent No.: US 10,615,060 B2
(45) Date of Patent: Apr. 7, 2020

(54) HEATING DEVICE

(71) Applicant: NGK SPARK PLUG CO., LTD., Nagoya-shi, Aichi (JP)

(72) Inventor: Jun Kurano, Kiyosui (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 289 days.

(21) Appl. No.: 15/718,440

(22) Filed: Sep. 28, 2017

(65) Prior Publication Data

US 2018/0090349 A1 Mar. 29, 2018

(30) Foreign Application Priority Data

Sep. 29, 2016 (JP) .................................. 2016-190605

(51) Int. Cl.
*H01L 21/67* (2006.01)
*H05B 3/02* (2006.01)
(Continued)

(52) U.S. Cl.
CPC .. *H01L 21/67103* (2013.01); *H01L 21/68792* (2013.01); *H05B 3/02* (2013.01); *H05B 3/22* (2013.01)

(58) Field of Classification Search
CPC ........ H01L 21/67103; H01L 21/68792; H05B 3/02; H05B 3/22
(Continued)

(56) References Cited

U.S. PATENT DOCUMENTS 6,376,811 B2 * 4/2002 Yamaguchi ....... H01L 21/67103
219/444.1
6,465,763 B1 * 10/2002 Ito .................... H01L 21/67103
118/725
(Continued)

FOREIGN PATENT DOCUMENTS

| JP | H10-242252 A | | 9/1998 |
|---|---|---|---|
| KR | 10-2008-0037879 A | | 5/2008 |
| KR | 20080037879 A | * | 5/2008 |

OTHER PUBLICATIONS

Korean Intellectual Property Office, Office Action (Notification of Reason for Refusal) issued in corresponding Application No. 10-2017-0126330, dated Sep. 5, 2019.

*Primary Examiner* — Jimmy Chou
(74) *Attorney, Agent, or Firm* — Stites & Harbison, PLLC; Jeffrey A. Haeberlin; James R. Hayne

(57) ABSTRACT

A heating device includes a holding member and having thereinside a plurality of resistive heating elements connected to different pairs of electrode terminals, and a columnar support joined to the second surface of the holding member. The plurality of resistive heating elements include a first resistive heating element and a second resistive heating element. The first resistive heating element is disposed throughout a first region including a region that overlaps the columnar support member as viewed from the first direction and a second region that is located around the outer periphery of the first region and that does not overlap the columnar support member as viewed from the first direction. The second resistive heating element is disposed at a position closer to the first surface than the first resistive heating element in the first direction and is disposed in only the first region.

2 Claims, 8 Drawing Sheets

(51) Int. Cl.
*H05B 3/22* (2006.01)
*H01L 21/687* (2006.01)

(58) Field of Classification Search
USPC .......................................... 219/444.1, 468.1
See application file for complete search history.

(56) References Cited

U.S. PATENT DOCUMENTS

| | | | | |
|---|---|---|---|---|
| 6,475,606 B2* | 11/2002 | Niwa | ................... | C04B 41/009 |
| | | | | 219/538 |
| 6,507,006 B1* | 1/2003 | Hiramatsu | ........ | H01L 21/67103 |
| | | | | 219/444.1 |
| 6,518,551 B2* | 2/2003 | Watanabe | ............ | G02B 6/2558 |
| | | | | 219/466.1 |
| 6,645,304 B2* | 11/2003 | Yamaguchi | ....... | H01L 21/67103 |
| | | | | 118/500 |
| 6,891,263 B2* | 5/2005 | Hiramatsu | ........... | H01L 21/6732 |
| | | | | 118/724 |
| 6,929,874 B2* | 8/2005 | Hiramatsu | .............. | B32B 18/00 |
| | | | | 219/544 |
| 7,126,090 B2* | 10/2006 | Yamaguchi | ....... | H01L 21/67103 |
| | | | | 219/444.1 |
| 7,211,153 B2* | 5/2007 | Kuibira | ................... | B32B 18/00 |
| | | | | 118/725 |
| 7,525,071 B2* | 4/2009 | Goto | ................. | H01L 21/67103 |
| | | | | 118/724 |
| 7,560,668 B2* | 7/2009 | Tomita | .............. | H01J 37/32009 |
| | | | | 118/725 |
| 7,679,034 B2* | 3/2010 | Goto | ................. | H01L 21/67103 |
| | | | | 118/724 |
| 8,193,473 B2* | 6/2012 | Unno | ................. | H01L 21/67103 |
| | | | | 118/725 |
| 2001/0027972 A1* | 10/2001 | Yamaguchi | ....... | H01L 21/67103 |
| | | | | 219/468.1 |
| 2001/0042744 A1* | 11/2001 | Tachikawa | ........ | H01L 21/67103 |
| | | | | 219/444.1 |
| 2002/0055021 A1* | 5/2002 | Niwa | .................... | C04B 35/581 |
| | | | | 428/698 |
| 2002/0063120 A1* | 5/2002 | Yamaguchi | ....... | H01L 21/67103 |
| | | | | 219/444.1 |
| 2002/0102512 A1* | 8/2002 | Yamaguchi | ....... | H01L 21/67103 |
| | | | | 432/258 |
| 2002/0170679 A1* | 11/2002 | Yamaguchi | ......... | C23C 16/4409 |
| | | | | 156/345.51 |
| 2002/0185487 A1* | 12/2002 | Divakar | ............ | H01L 21/67103 |
| | | | | 219/444.1 |
| 2003/0015515 A1* | 1/2003 | Ito | ..................... | H01L 21/67103 |
| | | | | 219/444.1 |
| 2003/0015521 A1* | 1/2003 | Ito | .......................... | H05B 3/143 |
| | | | | 219/544 |
| 2003/0039796 A1* | 2/2003 | Ito | ..................... | H01L 21/67103 |
| | | | | 428/66.6 |
| 2003/0042247 A1* | 3/2003 | Ito | ..................... | H01L 21/67103 |
| | | | | 219/465.1 |
| 2003/0044653 A1* | 3/2003 | Hiramatsu | .............. | B32B 18/00 |
| | | | | 428/704 |
| 2003/0051665 A1* | 3/2003 | Zhao | ................. | C23C 16/45565 |
| | | | | 118/723 E |
| 2003/0075537 A1* | 4/2003 | Okajima | ........... | H01L 21/67103 |
| | | | | 219/444.1 |
| 2003/0094447 A1* | 5/2003 | Yamaguchi | ....... | H01L 21/67103 |
| | | | | 219/444.1 |
| 2003/0098299 A1* | 5/2003 | Hiramatsu | .......... | C04B 38/0054 |
| | | | | 219/444.1 |
| 2003/0183615 A1* | 10/2003 | Yamaguchi | ....... | H01L 21/67103 |
| | | | | 219/444.1 |
| 2003/0183616 A1* | 10/2003 | Goto | ..................... | H05B 3/283 |
| | | | | 219/444.1 |
| 2004/0040665 A1* | 3/2004 | Mizuno | ............... | H01L 21/6833 |
| | | | | 156/345.51 |
| 2004/0108308 A1* | 6/2004 | Okajima | ........... | H01L 21/67103 |
| | | | | 219/468.1 |
| 2004/0117977 A1* | 6/2004 | Hiramatsu | ........ | H01L 21/67103 |
| | | | | 29/611 |
| 2004/0144312 A1* | 7/2004 | Goto | ....................... | C23C 16/46 |
| | | | | 118/715 |
| 2004/0149718 A1* | 8/2004 | Ito | ..................... | H01L 21/67103 |
| | | | | 219/444.1 |
| 2004/0168641 A1* | 9/2004 | Kuibira | ............... | C23C 16/4409 |
| | | | | 118/728 |
| 2004/0222210 A1* | 11/2004 | Lin | ................... | H01L 21/67103 |
| | | | | 219/444.1 |
| 2005/0016986 A1* | 1/2005 | Ito | .......................... | B32B 18/00 |
| | | | | 219/444.1 |
| 2005/0077284 A1* | 4/2005 | Natsuhara | ......... | H01L 21/67103 |
| | | | | 219/444.1 |
| 2005/0166848 A1* | 8/2005 | Natsuhara | .......... | H01L 21/67103 |
| | | | | 118/728 |
| 2005/0184055 A1* | 8/2005 | Natsuhara | ......... | H01L 21/67103 |
| | | | | 219/548 |
| 2005/0194374 A1* | 9/2005 | Gelatos | .................. | H05B 3/283 |
| | | | | 219/444.1 |
| 2006/0011611 A1* | 1/2006 | Goto | ................. | H01L 21/67103 |
| | | | | 219/444.1 |
| 2006/0096972 A1* | 5/2006 | Nakamura | ........ | H01L 21/67103 |
| | | | | 219/444.1 |
| 2006/0151465 A1* | 7/2006 | Lin | ................... | H01L 21/67103 |
| | | | | 219/444.1 |
| 2006/0169688 A1* | 8/2006 | Mori | ...................... | B23K 35/24 |
| | | | | 219/444.1 |
| 2006/0221539 A1* | 10/2006 | Morita | .............. | H01L 21/67103 |
| | | | | 361/234 |
| 2006/0231034 A1* | 10/2006 | Goto | ................. | H01L 21/67103 |
| | | | | 118/725 |
| 2006/0280875 A1* | 12/2006 | Tomita | .............. | H01J 37/32009 |
| | | | | 427/488 |
| 2008/0006618 A1* | 1/2008 | Futakuchiya | ..... | H01L 21/67103 |
| | | | | 219/444.1 |
| 2008/0110874 A1* | 5/2008 | Hayashi | ............ | H01L 21/67103 |
| | | | | 219/444.1 |
| 2008/0302781 A1* | 12/2008 | Murakami | .......... | C23C 16/4586 |
| | | | | 219/444.1 |
| 2009/0078694 A1* | 3/2009 | Hayashi | ............ | H01L 21/67109 |
| | | | | 219/444.1 |
| 2009/0277895 A1* | 11/2009 | Komatsu | .............. | C23C 16/4586 |
| | | | | 219/438 |
| 2010/0163188 A1* | 7/2010 | Tanaka | .............. | H01L 21/67103 |
| | | | | 156/345.52 |
| 2010/0193502 A1* | 8/2010 | Kim | ........................ | H05B 3/68 |
| | | | | 219/482 |
| 2010/0243635 A1* | 9/2010 | Nakamura | ................. | F23Q 7/22 |
| | | | | 219/270 |
| 2013/0248509 A1* | 9/2013 | Unno | ............... | H01L 21/68792 |
| | | | | 219/444.1 |
| 2013/0256297 A1* | 10/2013 | Nobori | ................ | H01L 21/6831 |
| | | | | 219/544 |
| 2013/0319762 A1* | 12/2013 | Harris | ................ | H01L 21/67103 |
| | | | | 174/94 R |
| 2014/0231019 A1* | 8/2014 | Kajihara | ............. | H01J 37/32532 |
| | | | | 156/345.51 |
| 2015/0109716 A1* | 4/2015 | Konno | ................ | H01L 21/6831 |
| | | | | 361/234 |
| 2015/0373783 A1* | 12/2015 | Kitagawa | ................. | H05B 3/26 |
| | | | | 156/345.52 |
| 2017/0110357 A1* | 4/2017 | Ishikawa | ............. | H01L 21/6833 |
| 2017/0170052 A1* | 6/2017 | Takebayashi | ..... | H01L 21/67103 |
| 2017/0278732 A1* | 9/2017 | Amano | ............ | H01L 21/67103 |
| 2018/0190501 A1* | 7/2018 | Ueda | ............... | H01L 21/67109 |
| 2018/0218885 A1* | 8/2018 | Maeda | ............... | C23C 16/5096 |

* cited by examiner

HEATING DEVICE

CROSS REFERENCE TO RELATED APPLICATION

The present application claims priority to Japanese Patent Application no. 2016-190605, which was filed on Sep. 29, 2016, the disclosure of which is herein incorporated by reference in its entirety.

BACKGROUND OF THE INVENTION

Field of the Invention

The technology disclosed herein relates to a heating device.

Description of the Related Art

Heating devices (also referred to as "susceptors") for heating an object (for example, a semiconductor wafer), while holding the object, to a predetermined treatment temperature (for example, about 400 to 650° C.) have been developed. The heating device is used, for example, as a part of a semiconductor manufacturing apparatus such as a film deposition apparatus (for example, a CVD apparatus or sputtering apparatus) and etching equipment (for example, plasma etching equipment).

In general, a heating device includes a plate-like holding member having a holding surface and a reverse face which are substantially orthogonal to a predetermined direction (hereinafter referred to as a "first direction") and a columnar support member which extends in the first direction and is joined to the reverse face of the holding member. A resistive heating element is disposed inside the holding member. When a voltage is applied to the resistive heating element, the resistive heating element generates heat, and the object (for example, a semiconductor wafer) held on the holding surface of the holding member is heated to, for example, about 400 to 650° C. (refer to, for example, PTL 1).

PATENT LITERATURE

PTL 1 is Japanese Unexamined Patent Application Publication No. 10-242252.

SUMMARY OF THE INVENTION

In recent years, to fabricate a finer pattern and increase yield in a semiconductor manufacturing process, there has been a growing demand for improvement in the uniformity of temperature across the holding surface of the heating device (the surface thermal uniformity). However, since heat generated by the resistive heating element inside the holding member escapes through the columnar support member (hereinafter, this phenomenon is referred to as "heat escape"), the temperature of a portion of the holding member that overlaps the columnar support member as viewed from the first direction tends to decrease. As a result, the surface thermal uniformity of the holding surface may be decreased.

Accordingly, a technology capable of removing the above-mentioned situation is provided.

The technology described herein can be provided in the form of the following embodiments, for example.

(1) A heating device for heating an object is disclosed herein. The heating device for heating an object includes a holding member having a shape of a plate with first and second surfaces substantially orthogonal to a first direction and having thereinside a plurality of resistive heating elements connected to different pairs of electrode terminals, where the object is held on the first surface of the holding member, and a columnar support member having a columnar shape extending in the first direction, where the columnar support member is joined to the second surface of the holding member. The plurality of resistive heating elements include a first resistive heating element and a second resistive heating element. The first resistive heating element is disposed within the holding member throughout a first region of the holding member that, as viewed from the first direction, overlaps the columnar support member and a second region that, as viewed from the first direction, is located around an outer periphery of the first region and that does not overlap the columnar support member. The second resistive heating element is disposed within the holding member at a position in the first direction that is closer to the first surface than a position of the first resistive heating element in the first direction and is disposed in only the first region. As described above, according to the heating device, the holding member has thereinside the plurality of resistive heating elements connected to different pairs of electrode terminals. In other words, the first resistive heating element is connected to a first pair of electrode terminals, and the second resistive heating element is connected to a second pair of electrode terminals different the first pair of electrode terminals. The plurality of resistive heating elements include the second resistive heating element disposed in only the first region in addition to the first resistive heating element disposed throughout the first region and the second region. Thus, according to the heating device, the first region and the second region of the holding member can be heated by controlling the first resistive heating element to generate heat. At the same time, the first region of the holding member can be heated by controlling the second resistive heating element to generate heat independently from the first resistive heating element. As a result, according to the heating device, by heating the first region of the holding member by using the second resistive heating element, a decrease in the surface thermal uniformity of the first surface caused by the influence of heat escape through the columnar support member can be reduced. In addition, according to the heating device, since the second resistive heating element is disposed at a position closer to the first surface than the first resistive heating element in the first direction, the temperature of a portion of the first surface in the first region can be rapidly increased by controlling the second resistive heating element to generate heat. As a result, the surface thermal uniformity of the first surface can be rapidly and highly improved.

(2) According to the above-described embodiment, the plurality of resistive heating elements may be configured to further include a third resistive heating element that is disposed within the holding member at a position in the first direction substantially the same as a position of the first resistive heating element in the first direction and that is disposed in only a third region of the holding member that, as viewed from the first direction, is located around an outer periphery of the second region. According to the heating device, by controlling the third resistive heating element to generate heat, the third region of the holding member can be heated independently from heating of the first region and the second region by using the first resistive heating element and the second resistive heating element. As a result, according to the heating device, by heating the third region of the holding member by using the third resistive heating element, the temperature of the outer peripheral portion of the first surface can be controlled and, thus, the surface thermal uniformity of the first surface can be improved more. In addition, according to the heating device, since the third resistive heating element is disposed at a position that is substantially the same as the position of the first resistive heating element in the first direction, that is, a position farther away from the first surface than the second resistive heating element, the length of the path along which the heat generated by the third resistive heating element is transferred to the first surface can be increased. Consequently, the difference in temperature that occurs around the boundary between the second region and the third region of the first surface can be reduced and, thus, the surface thermal uniformity of the first surface can be improved more.

(3) According to the above-described embodiment, the plurality of resistive heating elements may be configured to further include a third resistive heating element that is disposed within the holding member at a position in the first direction substantially the same as a position of the second resistive heating element in the first direction and that is disposed in only a third region of the holding member that, as viewed from the first direction, is located around an outer periphery of the second region. According to the heating device, by controlling the third resistive heating element to generate heat, the third region of the holding member can be heated independently from the first region and the second region heated by the first resistive heating element and the second resistive heating element. As a result, according to the heating device, by heating the third region of the holding member by using the third resistive heating element, the temperature of the outer peripheral portion of the first surface can be controlled and, thus, the surface thermal uniformity of the first surface can be improved more. In addition, according to the heating device, since the third resistive heating element is disposed at a position that is substantially the same as the position of the second resistive heating element in the first direction, that is, a position closer to the first surface than the first resistive heating element, the temperature of the first surface in the third region can be quickly increased by controlling the third resistive heating element to generate heat and, thus, the surface thermal uniformity of the first surface can be rapidly and highly improved.

Note that the technology disclosed herein can be realized in various forms and, for example, the technology can be realized in the form of a heating device, a semiconductor manufacturing device, a manufacturing method thereof, or the like.

BRIEF DESCRIPTION OF THE DRAWINGS

Illustrative aspects of the invention will be described in detail with reference to the following figures wherein:

FIGS. 2, 4, and 5) according to the first embodiment.

FIG. 4 is a schematic illustration of the cross-sectional configuration of the heating device (the cross-sectional configuration taken along line IV-IV of FIG. 3) according to the first embodiment.

FIG. 5 is a schematic illustration of the cross-sectional configuration of the heating device (the cross-sectional configuration taken along line V-V of FIG. 3) according to the first embodiment.

FIG. 7 is a schematic illustration of the cross-sectional configuration of the heating device (the cross-sectional configuration taken along line VII-VII of FIG. 6) according to the second embodiment.

FIG. 8 is a schematic illustration of the cross-sectional configuration of the heating device (the cross-sectional configuration taken along line VIII-VIII of FIG. 6) according to the second embodiment.

DETAILED DESCRIPTION OF EXEMPLARY EMBODIMENTS OF THE INVENTION

First Embodiment
Configuration of Heating Device

Figure 1:
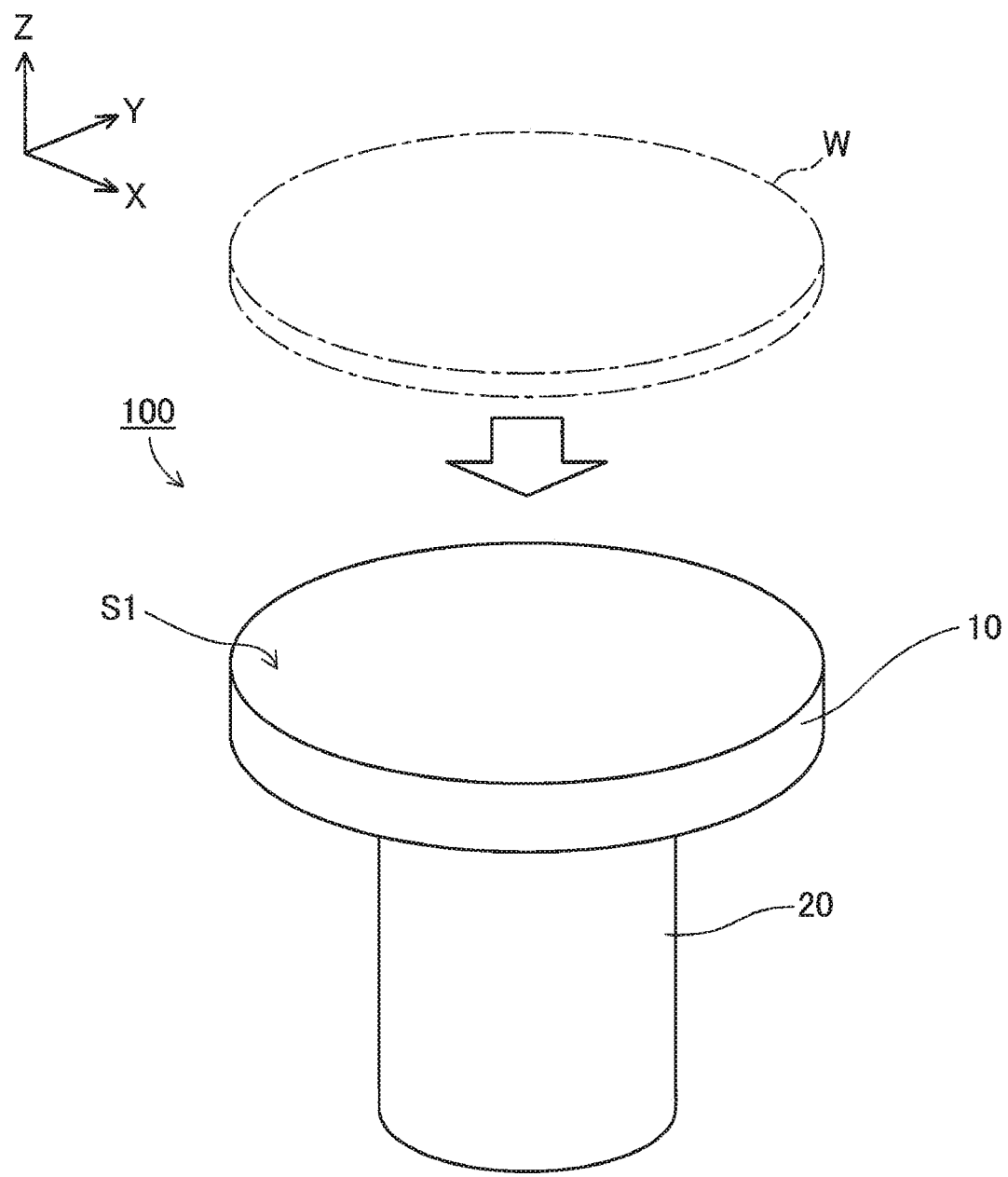
FIG. 1 is a perspective view schematically illustrating the external configuration of a heating device according to a first embodiment.
Figure 2:
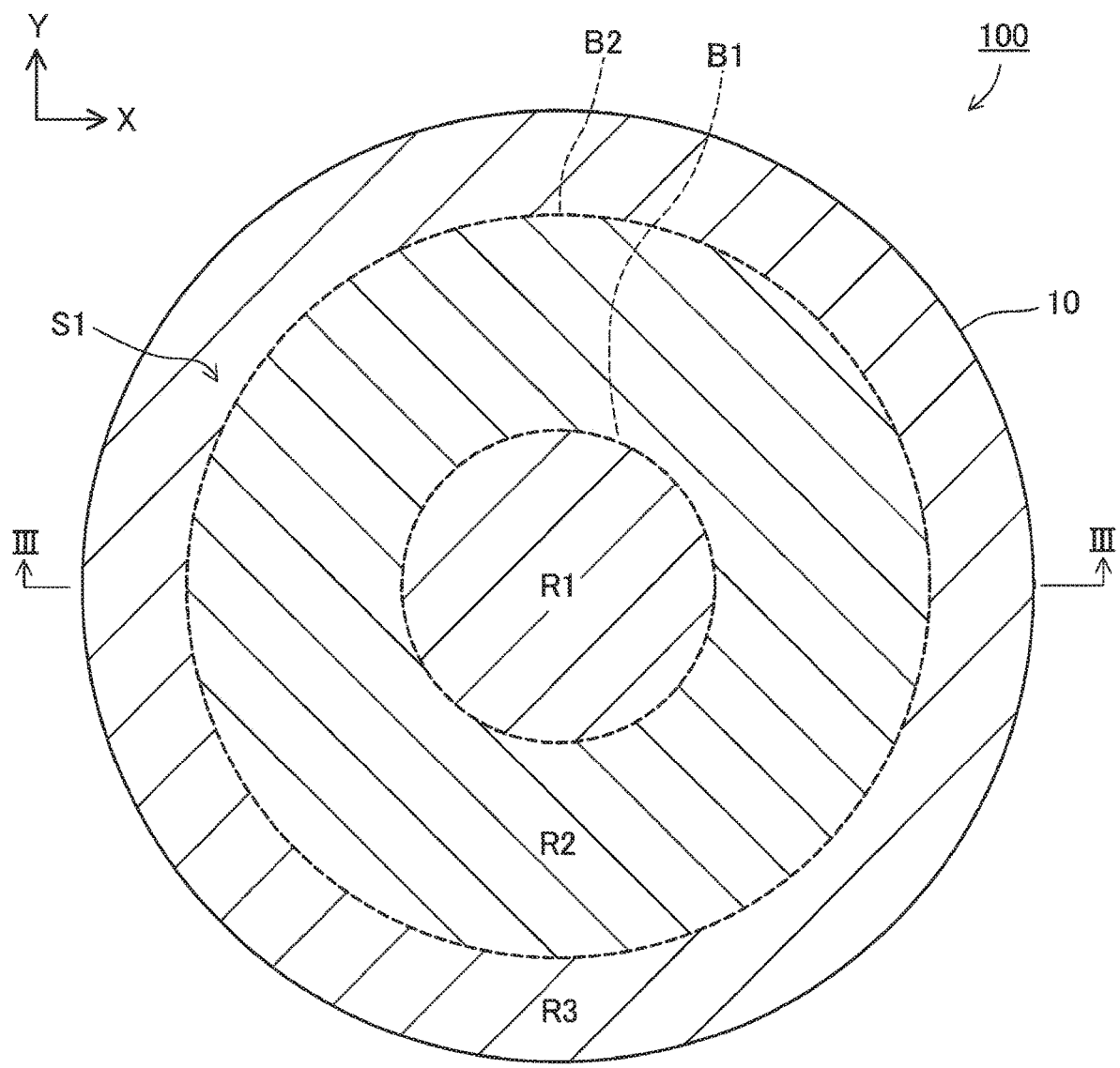
FIG. 2 is a schematic illustration of the planar configuration of the heating device according to the first embodiment.
Figure 3:
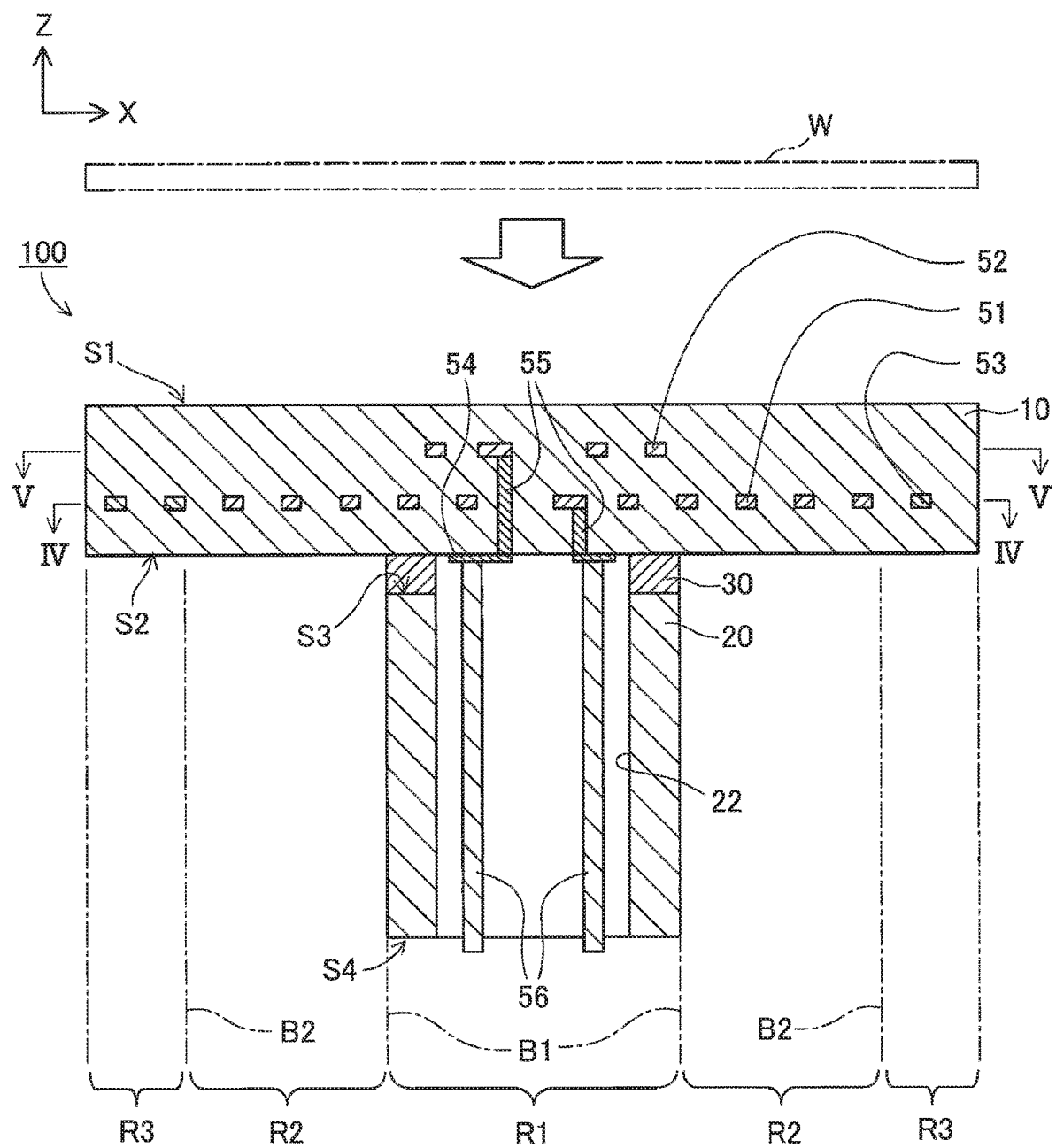
FIG. 3 is a schematic illustration of the cross-sectional configuration of the heating device (the cross-sectional configuration taken along line III-III of FIGS.
Figure 4:
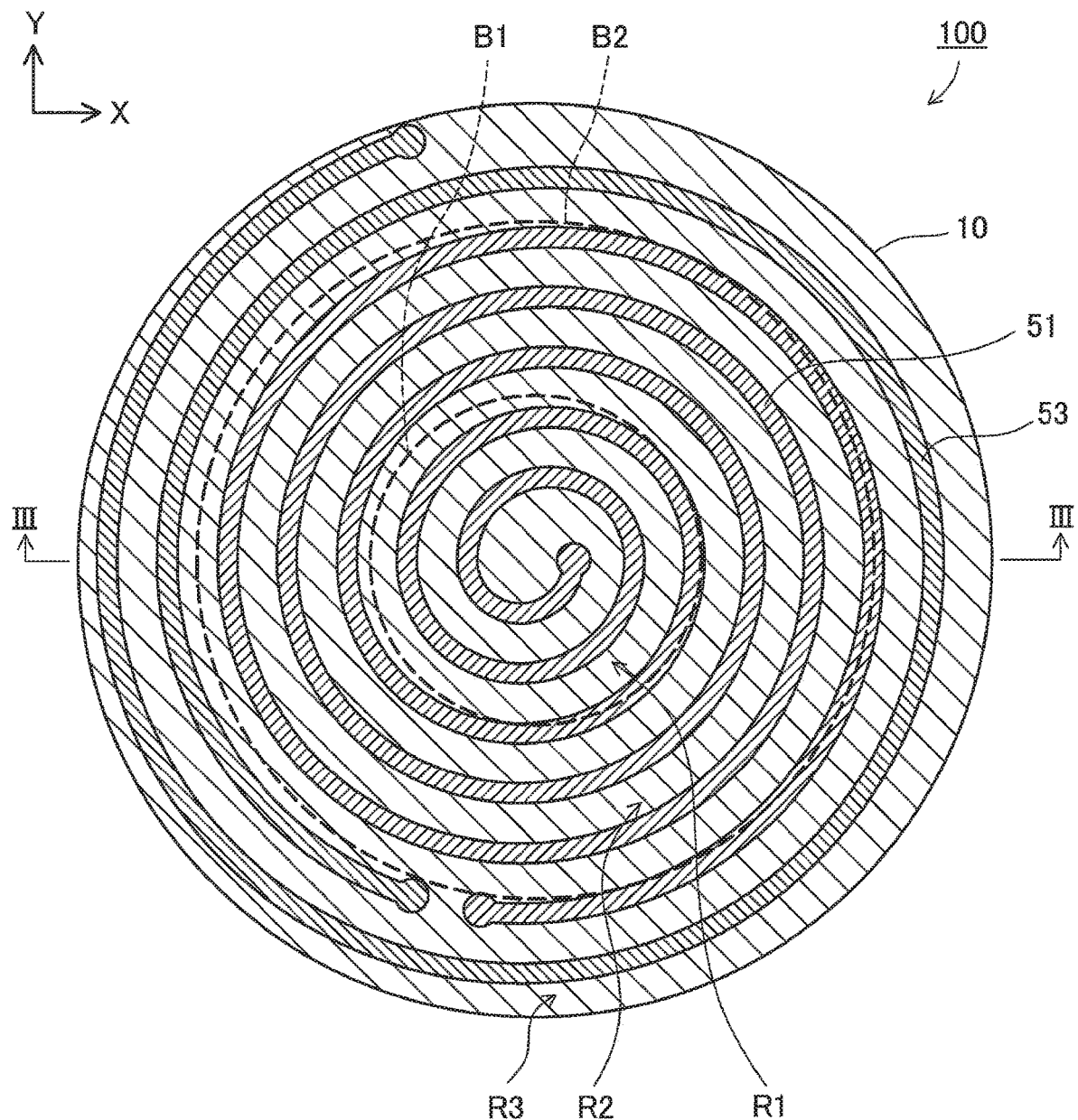
Figure 5:
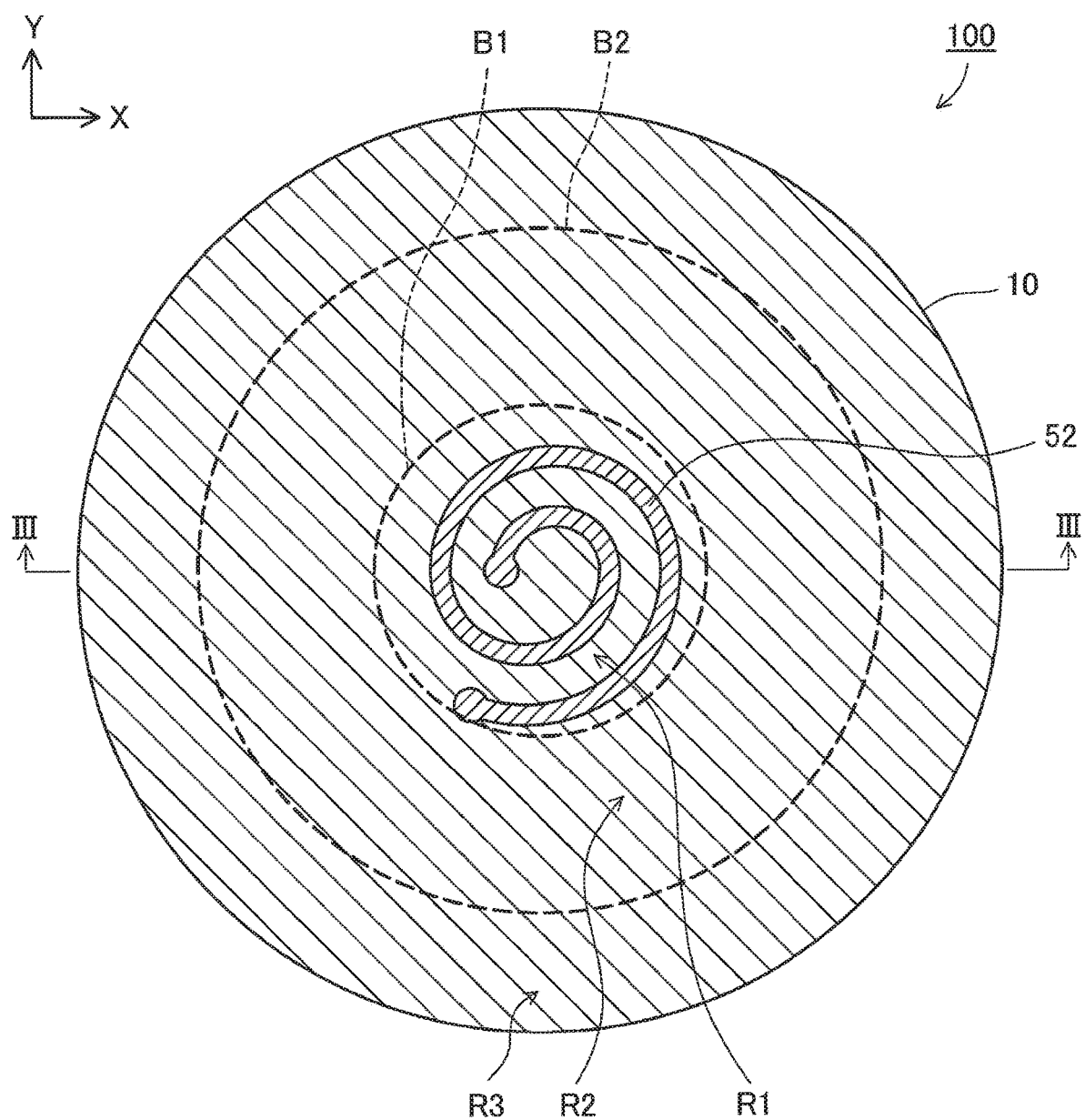

FIG. 1 is a perspective view schematically illustrating the external configuration of a heating device 100 according to a first embodiment. FIG. 2 is a schematic illustration of the planar (upper surface) configuration of the heating device 100 according to the first embodiment. FIGS.FIGS. 3 to 5 are schematic illustrations of the cross-sectional configuration of the heating device 100 according to the first embodiment. The XZ cross-sectional configuration of the heating device 100 taken along line III-III of FIGS.FIGS. 2, 4, and 5 is illustrated in FIG. 3. The XY cross-sectional configuration of the heating device 100 taken along line IV-IV of FIG. 3 is illustrated in FIG. 4.

The XY cross-sectional configuration of the heating device 100 taken along line V-V of FIG. 3 is illustrated in FIG. 5. In each of FIGS.FIGS. 1 to 5, the X, Y, and Z axes which are orthogonal to one another are illustrated to identify the directions. As used herein, for convenience of description, the positive Z-axis direction is referred to as an "upward direction", and the negative Z-axis direction is referred to as a "downward direction". However, in practice, the heating device 100 may be installed in a direction that differs from a direction defined by such directions. The same applies to FIG. 6 and the subsequent figures.

The heating device 100 is a device that holds an object (for example, a semiconductor wafer W) and heats the object to a predetermined processing temperature (for example, about 400 to 650° C.). A heating device is also referred to as a "susceptor". For example, the heating device 100 is used as a part of a semiconductor manufacturing apparatus, such as a film deposition apparatus (for example, a CVD apparatus, or a sputtering apparatus) or an etching apparatus (for example, a plasma etching apparatus).

The heating device 100 includes a holding member 10 and a columnar support member 20.

The holding member 10 is a substantially disk-shaped member having a holding surface S1 and a reverse face S2 which are substantially orthogonal to a predetermined direction (the vertical direction according to the present embodiment, that is, the Z-axis direction). The holding member 10 is made of, for example, ceramic mainly containing AlN (aluminum nitride) or $Al_2O_3$ (alumina). The term "mainly containing XXX" as used herein means that the content of XXX is the highest (by weight). The diameter of the holding member 10 is, for example, about 100 mm or greater and about 500 mm or less, and the thickness (the length in the vertical direction) of the holding member 10 is, for example, about 3 mm or greater and about 10 mm or less. The predetermined direction (the vertical direction) corresponds to a "first direction" in the claims, the holding surface S1 of the holding member 10 corresponds to a "first surface" in the claims, and the reverse face S2 of the holding member 10 corresponds to a "second surface" in the claims.

The columnar support member 20 is a member having a substantially cylindrical shape and extending in the predetermined direction (the vertical direction). The columnar support member 20 has a through-hole 22 formed therein, which pass through the columnar support member 20 from an upper surface S3 to a lower surface S4. Like the holding member 10, the columnar support member 20 is formed of ceramic mainly containing AlN or $Al_2O_3$, for example. The columnar support member 20 has an outer diameter of, for example, about 30 mm or greater and about 90 mm or less, and the columnar support member 20 has a height (the length in the vertical direction) of, for example, about 100 mm or greater and about 300 mm or less.

The holding member 10 and the columnar support member 20 are disposed such that the reverse face S2 of the holding member 10 and an upper surface S3 of the columnar support member 20 face each other in the vertical direction. The columnar support member 20 is joined to the central portion of the reverse face S2 of the holding member 10 or its vicinity via a joining layer 30 made of a known jointing material.

As illustrated in FIGS. 3 to 5, three resistive heating elements (a first resistive heating element 51, a second resistive heating element 52, and a third resistive heating element 53) which function as heaters for heating the holding member 10 are disposed inside the holding member 10. The resistive heating elements 51, 52, and 53 are formed of a conductive material, such as tungsten or molybdenum.

Here, according to the heating device 100 of the present embodiment, the holding member 10 has a first region R1, a second region R2, and a third region R3. The first region R1 is a substantially cylindrical region that overlaps the columnar support member 20 as viewed from the Z-axis direction. The second region R2 is a substantially tubular region that is located around the outer periphery of the first region R1 and that does not overlap the columnar support member 20 as viewed from the Z-axis direction. In addition, the third region R3 is a substantially tubular region that is located around the outer periphery of the second region R2 and that includes the outer circumferential line of the holding member 10 as viewed from the Z-axis direction. That is, as viewed from the Z-axis direction, the first region R1 is located in the central portion of the holding member 10, the third region R3 is located in the outer peripheral portion of the holding member 10, and the second region R2 is located between the first region R1 and the third region R3. The position of a boundary line B1 between the first region R1 and the second region R2 coincides with the position of the outer circumferential line of the columnar support member 20, as viewed from the Z-axis direction. In addition, the position of a boundary line B2 between the second region R2 and the third region R3 is appropriately set, as viewed from the Z-axis direction. For example, the position of the boundary line B2 is set so as to be located inwardly away from the outer circumferential line of the holding member 10 by a distance of about 1/5 to 1/18 of the diameter of the holding member 10. Note that the situation where a region overlaps the columnar support member 20 as viewed from the Z-axis direction refers to a situation where the region overlaps a region surrounded by the outer circumferential line of the columnar support member 20 as viewed from the Z-axis direction, and the situation where a region does not overlap the columnar support member 20 as viewed from the Z-axis direction refers to a situation where the region does not overlap a region surrounded by the outer circumferential line of the columnar support member 20 as viewed from the Z-axis direction.

As illustrated in FIG. 4, the first resistive heating element 51 is disposed throughout the first region R1 and the second region R2 of the holding member 10. That is, the first resistive heating element 51 is disposed in a portion of the holding member 10 other than the outer peripheral portion of the holding member 10 as viewed from the Z-axis direction. In addition, the third resistive heating element 53 is disposed in only the third region R3 of the holding member 10. That is, the third resistive heating element 53 is disposed in the outer peripheral portion of the holding member 10 as viewed from the Z-axis direction. The position of the third resistive heating element 53 in the vertical direction is substantially the same as the position of the first resistive heating element 51 in the vertical direction. Note that according to the present embodiment, each of the first resistive heating element 51 and the third resistive heating element 53 forms a substantially spiral pattern, as viewed from the Z-axis direction.

In contrast, as illustrated in FIG. 5, the second resistive heating element 52 is disposed in only the first region R1 of the holding member 10. That is, the second resistive heating element 52 is disposed in the central portion of the holding member 10 (a portion that overlaps the columnar support member 20) as viewed from the Z-axis direction. The position of the second resistive heating element 52 in the vertical direction is a position closer to the holding surface S1 than the first resistive heating element 51 (that is, a position above the first resistive heating element 51). Note that according to the present embodiment, the second resistive heating element 52 forms a substantially spiral pattern, as viewed from the Z-axis direction.

The heating device 100 is configured such that a voltage is applied to each of the three resistive heating elements 51, 52, and 53. More specifically, a pair of electrode terminals 56 corresponding to each of the three resistive heating elements 51, 52, and 53 is accommodated in the through hole 22 of the columnar support member 20. One of the electrode terminals 56 in the pair corresponding to the first resistive heating element 51 is electrically connected to one of end portions of the first resistive heating element 51 via a power receiving electrode (an electrode pad) 54 provided on the reverse face S2 of the holding member 10 and a via conductor 55 provided inside of the holding member 10. The other electrode terminal 56 in the pair corresponding to the first resistive heating element 51 is electrically connected to the other end portion of the first resistive heating element 51 via a different power receiving electrode 54 and a different via conductor 55. In a similar manner, a pair of electrode terminals 56 corresponding to the second resistive heating element 52 and a pair of electrode terminals 56 corresponding to the third resistive heating element 53 are electrically connected to the end portions of the second resistive heating element 52 and the end portions of the third resistive heating element 53 via corresponding power receiving electrodes 54 and via conductors 55, respectively.

In this manner, each of the three resistive heating elements 51, 52, and 53 is connected to one of different pairs of electrode terminals 56. As used herein, the term "different pairs of electrode terminals 56" refers to a situation where combinations of the electrode terminals 56 are not completely identical. That is, a situation where each of the three resistive heating elements 51, 52, and 53 is connected to one of different pairs of electrode terminals 56 includes a situation where one of the electrode terminals 56 in a pair connected to one of the resistive heating elements (for example, the first resistive heating element 51) is not connected to another one of the resistive heating elements (for example, the second resistive heating element 52), but the other electrode terminal 56 in the pair connected to the one of the resistive heating elements (for example, the first resistive heating element 51) is connected to the other resistive heating element (for example, the second resistive heating element 52).

When a voltage is applied from a power source (not illustrated) to the first resistive heating element 51 via a pair of electrode terminals 56, a pair of power receiving electrodes 54, and a pair of via conductors 55 corresponding to the first resistive heating element 51, the first resistive heating element 51 generates heat. In a similar manner, each of the second resistive heating element 52 and the third resistive heating element 53 generates heat when a voltage is applied. If each of the resistive heating elements 51, 52, and 53 generates heat, the holding member 10 is heated and, thus, the object (for example, the semiconductor wafer W) which is held on the holding surface S1 of the holding member 10 is heated to a predetermined temperature (for example, about 400 to 650° C.). As described above, since the resistive heating elements 51, 52, and 53 are connected to different pairs of electrode terminals 56, the resistive heating elements 51, 52, and 53 can be independently controlled to generate heat.

In addition, the through hole 22 of the columnar support member 20 accommodates a thermocouple (not illustrated), and the upper end portion of the thermocouple is embedded in the central portion of the holding member 10. The temperature of the holding member 10 is measured by the thermocouple, and the temperature of the holding surface S1 of the holding member 10 is controlled on the basis of the result of measurement.

Method for Manufacturing Heating Device

A method for manufacturing the heating device 100 is as follows, for example. The holding member 10 and the columnar support member 20 are produced first.

An example of a method for manufacturing the holding member 10 is as follows. An organic solvent, such as toluene, is added to a mixture obtained by adding 1 part by weight of yttrium oxide ($Y_2O_3$) powder, 20 parts by weight of an acrylic binder, and an appropriate amount of a dispersant and a plasticizer to 100 parts by weight of aluminum nitride powder. Thereafter, the mixture is mixed by a ball mill to produce a slurry for a green sheet. The slurry for a green sheet is formed into a sheet shape by a casting apparatus and, thereafter, is dried to produce a plurality of green sheets.

In addition, a conductive powder, such as tungsten or molybdenum powder, is added to a mixture of aluminum nitride powder, acrylic binder, and organic solvents such as terpineol. Thereafter, the mixture is kneaded to produce a metallized paste. By printing the metallized paste by using, for example, a screen printing apparatus, an unsintered conductor layer is formed on a particular green sheet. The unsintered conductor layer is used to form, for example, the resistive heating elements 51, 52 or 53 or the power receiving electrode 54 afterward. In addition, by printing the metallized paste on a green sheet having a via hole formed in advance, an unsintered conductor portion to be used as a via conductor 55 afterward is formed.

Subsequently, a plurality of such green sheets (for example, 20 green sheets) are thermocompression-bonded. The outer circumference is cut out as needed. In this manner, a green sheet laminate is produced. The green sheet laminate is cut into a disk-shaped molded body by machining. Thereafter, the molded body is degreased, and the degreased molded body is sintered to produce a sintered body. The surface of the sintered body is polished. Through the above-described steps, the holding member 10 is manufactured.

In addition, an example of a method for manufacturing the columnar support member 20 is as follows. That is, an organic solvent, such as methanol, is added to a mixture obtained by adding 1 part by weight of yttrium oxide powder, 3 parts by weight of PVA binder, and an appropriate amount of dispersant and plasticizer to 100 parts by weight of aluminum nitride powder first. The mixture is blended in a ball mill to obtain slurry. The slurry is granulated by using a spray dryer to produce raw material powder. Subsequently, a rubber mold having core cylinders corresponding to the through hole 22 arranged therein is filled with the raw material powder, and cold isostatic pressing is performed to obtain a compact. The obtained compact is degreased, and the degreased body is sintered. Through the above-described steps, the columnar support member 20 is produced.

Subsequently, the holding member 10 and the columnar support member 20 are joined to each other. A lapping process is performed on the reverse face S2 of the holding member 10 and the upper surface S3 of the columnar support member 20 as necessary. Thereafter, a known joining material prepared by mixing, for example, rare earth and an organic solvent into a paste is uniformly applied to at least one of the reverse face S2 of the holding member 10 and the upper surface S3 of the columnar support member 20. Thereafter, a degreasing treatment is performed. Subsequently, the reverse face S2 of the holding member 10 and the upper surface S3 of the columnar support member 20 are overlapped, and the holding member 10 and the columnar support member 20 are joined by performing hot press sintering.

After joining the holding member 10 and the columnar support member 20 with each other, each of the electrode terminals 56 is inserted into the through hole 22. Thereafter, the upper end portion of each of the electrode terminals 56 is brazed to one of the power receiving electrodes 54 by, for example, a gold brazing filler metal. In addition, a thermocouple is inserted into the through hole 22, and the upper end portion of the thermocouple is embedded and fixed. By employing the above-described manufacturing method, the heating device 100 having the above-described configuration is manufactured.

Effect of First Embodiment

As described above, the heating device 100 according to the present embodiment includes the holding member 10 in a shape of a plate with the holding surface S1 and the reverse face S2 substantially orthogonal to the Z-axis direction, where the holding member 10 has thereinside a plurality of resistive heating elements each connected to one of different pairs of electrode terminals 56, and the columnar support member 20 having a columnar shape extending in the Z-axis direction, where the columnar support member 20 is joined to the reverse face S2 of the holding member 10. The heating device 100 heats an object, such as the semiconductor wafer W, held on the holding surface S1 of the holding member 10.

Here, in the holding member 10, the first region R1, which is a region that overlaps the columnar support member 20 as viewed from the Z-axis direction, is a region where the temperature is likely to decrease due to heat escape through the columnar support member 20. In contrast, in the holding member 10, the second region R2, which is located around the outer periphery of the first region R1 and does not overlap the columnar support member 20 as viewed from the Z-axis direction, is unsusceptible to heat escape through the columnar support member 20. Accordingly, the temperature of the holding surface S1 in the first region R1 is likely to be lower than the temperature of the holding surface S1 in the second region R2. As a result, the surface thermal uniformity of the holding surface S1 may be decreased.

According to the heating device 100 of the present embodiment, in addition to the first resistive heating element 51 that is disposed throughout the first region R1 and the second region R2, the above-described plurality of resistive heating elements include the second resistive heating element 52 that is disposed in only the first region R1. Since the second resistive heating element 52 is connected to a pair of electrode terminals 56 that differs from the pair of electrode terminals 56 connected to the first resistive heating element 51, the second resistive heating element 52 can be controlled independently from the first resistive heating element 51. Thus, according to the heating device 100 of the present embodiment, while heating the first region R1 and the second region R2 of the holding member 10 by controlling the first resistive heating element 51 to generate heat, the first region R1 of the holding member 10 can be heated by controlling the second resistive heating element 52 to generate heat independently from the first resistive heating element 51. As a result, according to the heating device 100 of the present embodiment, a decrease in the surface thermal uniformity of the holding surface S1 caused by the influence of heat escape through the columnar support member 20 can be reduced by the first region R1 of the holding member 10 heated by the second resistive heating element 52. In addition, according to the heating device 100 of the present embodiment, the second resistive heating element 52 is disposed closer to the holding surface S1 than the first resistive heating element 51 in the Z-axis direction. Accordingly, by controlling the second resistive heating element 52 to generate heat, the temperature of a portion of the holding surface S1 corresponding to the first region R1 can be rapidly increased and, thus, the surface thermal uniformity of the holding surface S1 can be rapidly and highly improved.

In addition, according to the heating device 100 of the present embodiment, the above-described plurality of resistive heating elements further include the third resistive heating element 53 disposed at substantially the same position as the position of the first resistive heating element 51 in the Z-axis direction and disposed in only the third region R3 located around the outer periphery of the second region R2 as viewed from the Z-axis direction. The third region R3 represents the outer peripheral portion of the holding member 10 as viewed from the Z-axis direction. Since the third resistive heating element 53 is connected to a pair of electrode terminals 56 that differs from the pairs of electrode terminals 56 connected to the first resistive heating element 51 and the second resistive heating element 52, the third resistive heating element 53 can be controlled independently from the first resistive heating element 51 and the second resistive heating element 52. Consequently, according to the heating device 100 of the present embodiment, by controlling the third resistive heating element 53 to generate heat, the third region R3 of the holding member 10 can be heated independently from the first region R1 and the second region R2 heated by the first resistive heating element 51 and the second resistive heating element 52. Thus, according to the heating device 100 of the present embodiment, by heating the third region R3 of the holding member 10 by using the third resistive heating element 53, the temperature of the outer peripheral portion of the holding surface S1 can be controlled. As a result, the surface thermal uniformity of the holding surface S1 can be increased more. Furthermore, according to the heating device 100 of the present embodiment, the third resistive heating element 53 is disposed at a position substantially the same as the position of the first resistive heating element 51 in the Z-axis direction. That is, the third resistive heating element 53 is disposed at a position farther away from the holding surface S1 than the second resistive heating element 52. Accordingly, the length of the path along which the heat generated by the third resistive heating element 53 is transferred to the holding surface S1 can be increased. As a result, the difference in temperature that occurs around the boundary between the second region R2 and the third region R3 of the holding surface S1 can be reduced and, thus, the surface thermal uniformity of the holding surface S1 can be improved more.

Second Embodiment

Figure 6:
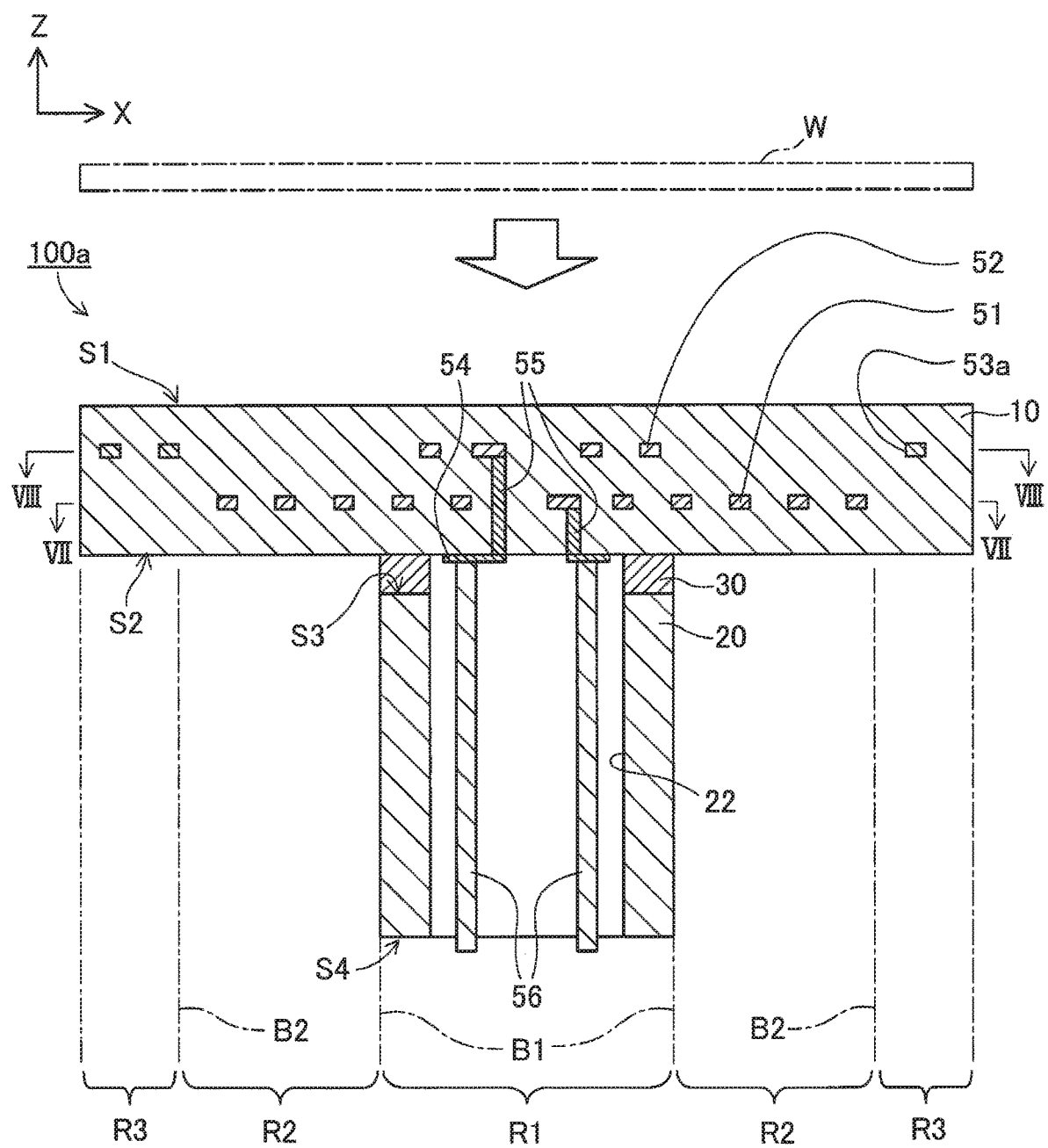
FIG. 6 is a schematic illustration of the cross-sectional configuration of a heating device (the cross-sectional configuration taken along line VI-VI of FIGS.
Figure 7:
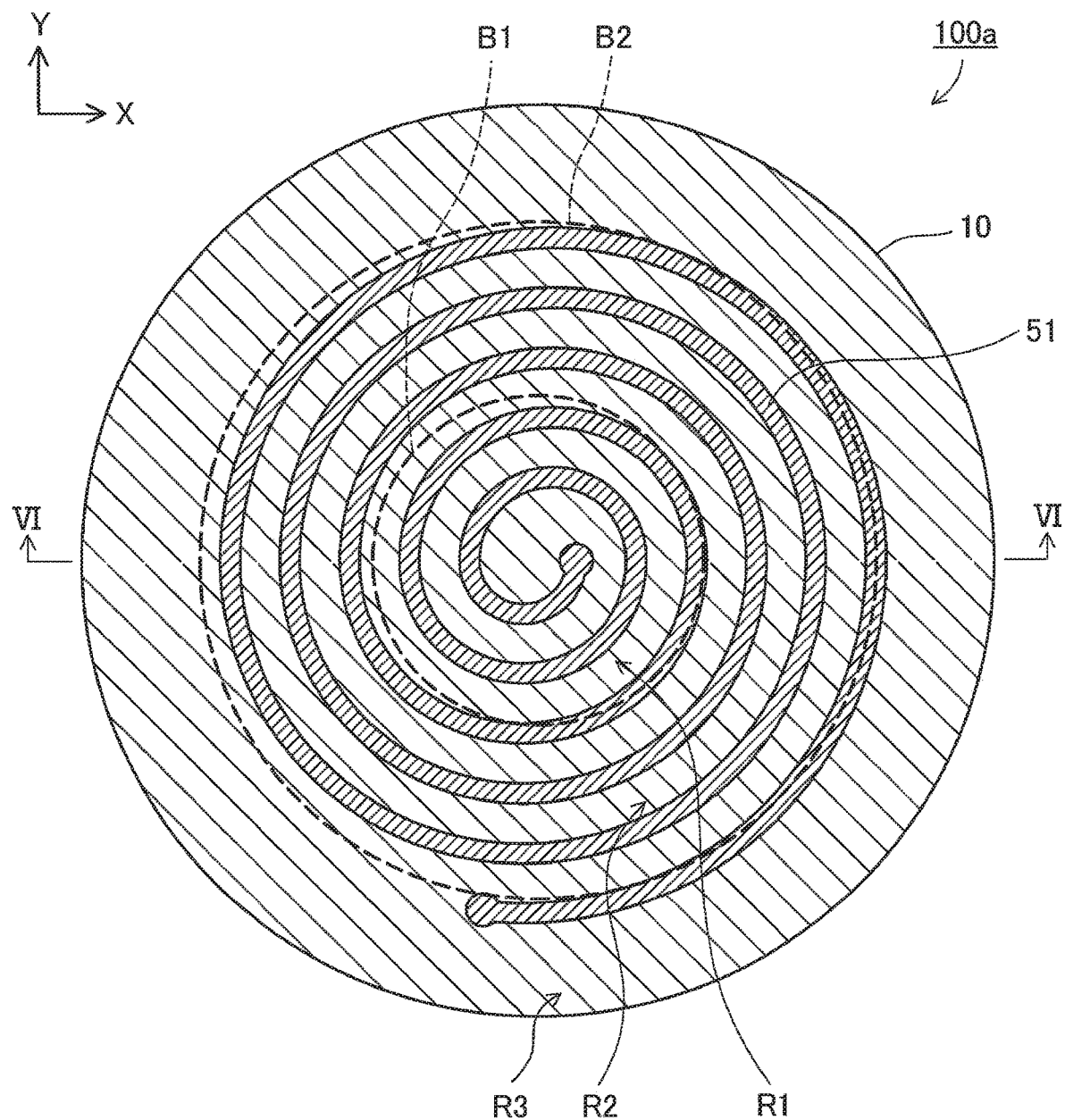
FIGS. 7 and 8) according to a second embodiment.
Figure 8:
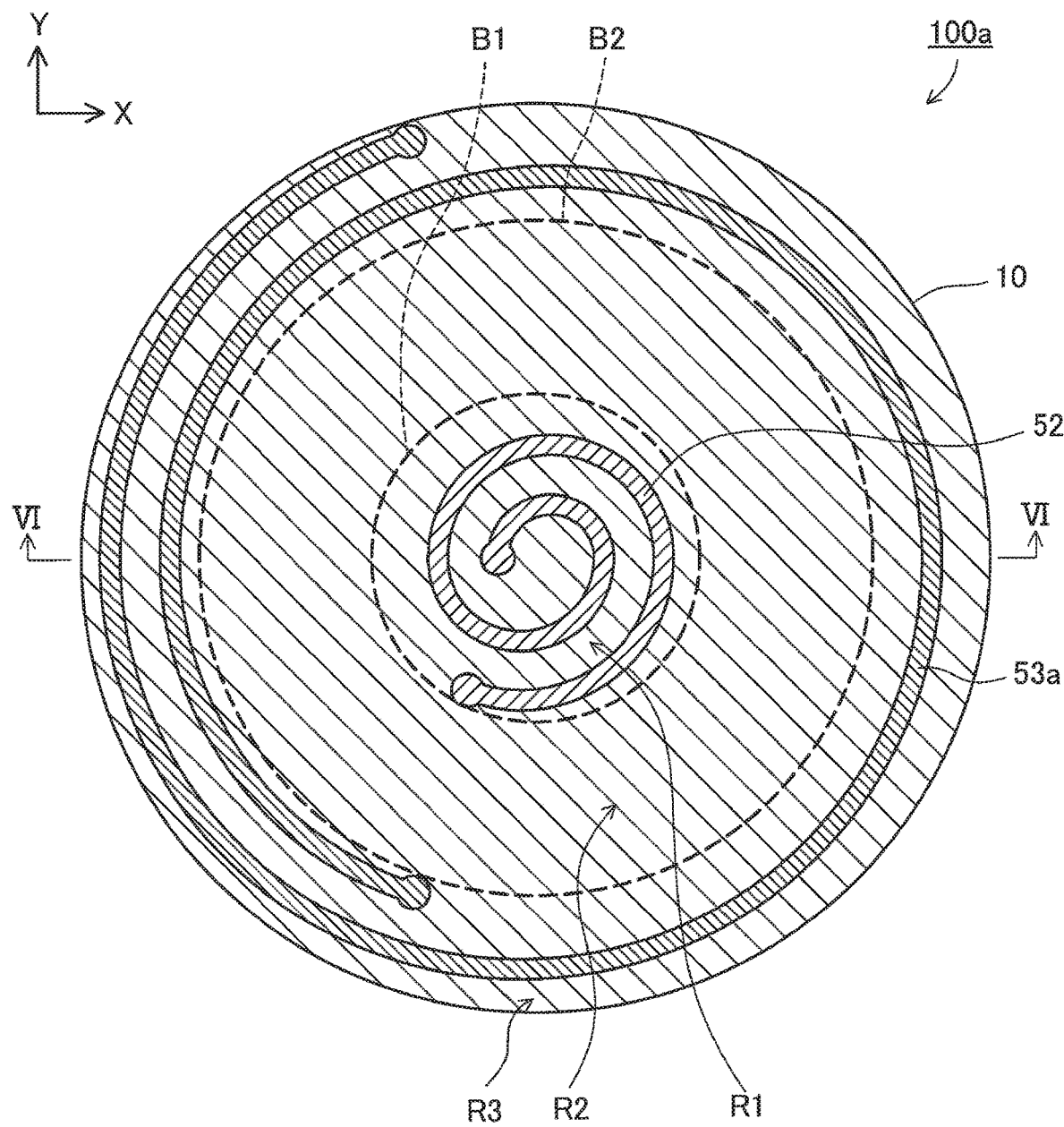

FIGS. 6 to 8 are schematic illustrations of the cross-sectional configuration of the heating device 100a according to a second embodiment. The XZ cross-sectional configuration of the heating device 100a taken along line VI-VI of FIGS. 7 and 8 is illustrated in FIG. 6. The XY cross-sectional configuration of the heating device 100a taken along line VII-VII of FIG. 6 is illustrated in FIG. 7. The XY cross-sectional configuration of the heating device 100a taken along line VIII-VIII of FIG. 6 is illustrated in FIG. 8. Hereinafter, according to the second embodiment, the same reference numerals are used for the constituent elements of the heating device 100a that are identical to the constituent elements of the heating device 100 according to the above-described first embodiment, and the description of the constituent elements is not repeated as appropriate.

The heating device 100a according to the second embodiment includes a third resistive heating element 53a having a configuration that differs from that in the above-described heating device 100 according to the first embodiment. More specifically, according to the heating device 100a of the second embodiment, the position of third resistive heating element 53a in the vertical direction is not substantially the same as the position of the first resistive heating element 51 and is substantially the same as the position of the second resistive heating element 52 in the vertical direction. The other configuration of the heating device 100a according to the second embodiment is the same as the configuration of the above-described heating device 100 of the first embodiment.

According to the heating device 100a of the second embodiment, like the above-described heating device 100 of the first embodiment, a plurality of resistive heating elements are provided inside the holding member 10, and the plurality of resistive heating elements include the second resistive heating element 52 disposed in only the first region R1 in addition to the first resistive heating element 51 disposed throughout the first region R1 and the second region R2. Accordingly, by heating the first region R1 of the holding member 10 by using the second resistive heating element 52, a decrease in the surface thermal uniformity of the holding surface S1 due to the influence of heat escape through the columnar support member 20 can be reduced. In addition, the second resistive heating element 52 is disposed at a position closer to the holding surface S1 than the first resistive heating element 51 in the Z-axis direction. Accordingly, by controlling the second resistive heating element 52 to generate heat, the temperature of the holding surface S1 in the first region R1 can be rapidly increased and, thus, the surface thermal uniformity of the holding surface S1 can be rapidly and highly improved.

Furthermore, according to the heating device 100a of the second embodiment, the plurality of resistive heating elements further include the third resistive heating element 53a disposed at a position substantially the same as the position of the second resistive heating element 52 in the Z-axis direction and disposed in only the third region R3 located around the outer periphery of the second region R2, as viewed from the Z-axis direction. Consequently, according to the heating device 100a of the second embodiment, by heating the third region R3 of the holding member 10 by using the third resistive heating element 53a, the temperature of the outer peripheral portion of the holding surface S1 can be controlled and, thus, the surface thermal uniformity of the holding surface S1 can be improved more. In addition, according to the heating device 100a of the second embodiment, the third resistive heating element 53a is disposed at a position that is substantially the same as the position of the second resistive heating element 52 in the Z-axis direction, that is, the position that is closer to the holding surface S1 than the first resistive heating element 51. Accordingly, by controlling the third resistive heating element 53a to generate heat, the temperature of the holding surface S1 in the third region R3 can be rapidly increased and, thus, the surface thermal uniformity of the holding surface S1 can be rapidly and highly improved.

Modifications

The technology disclosed herein is not limited to the above-described embodiments. A variety of modifications of the present embodiments can be made without departing from the sprit and the scope of the technology. For example, the following modifications can be made.

The configuration of the heating device 100 according to the above-described embodiments is merely illustrative, and a variety of modifications can be made. For example, while the above embodiments have been described with reference to the holding member 10 and the columnar support member 20 each having a substantially circular outer shape as viewed from the Z-axis direction, the holding member 10 and the columnar support member 20 may have another outer shape. In addition, while the above embodiments have been described with reference to the resistive heating elements 51, 52, and 53 each having a substantially spiral shape as viewed from the Z-axis direction, the heating elements 51, 52, and 53 may have another shape.

In addition, while the above embodiments have been described with reference to the first region R1 that is set in the holding member 10 and that overlaps the columnar support member 20 as viewed from the Z-axis direction, the entire first region R1 does not necessarily have to overlap the columnar support member 20 as viewed from the Z-axis direction. The first region R1 may be a region including a sub-region that overlaps the columnar support member 20 as viewed from the Z-axis direction. Furthermore, while the above embodiments have been described with reference to the second region R2 that is set in the holding member 10 and that does not overlap the columnar support member 20 as viewed from the Z-axis direction, the entire second region R2 does not necessarily have to be a region that does not overlap the columnar support member 20 as viewed from the Z-axis direction. The second region R2 can be a region including a sub-region that does not overlap the columnar support member 20 as viewed from the Z-axis direction.

In addition, while the above embodiments have been described with reference to the second region R2 located around the outer periphery of the first region R1 as viewed from the Z-axis direction, the second region R2 can be located outside of the outer periphery of the first region R1 as viewed from the Z-axis direction. The second region R2 does not necessarily have to be located around the outer periphery of the first region R1 as viewed from the Z-axis direction. Furthermore, while the above embodiments have been described with reference to the third region R3 around the outer periphery of the second region R2 as viewed from the Z-axis direction, the third region R3 can be located outside the outer periphery of the second region R2 as viewed from the Z-axis direction. The third region R3 does not necessarily have to be located around the outer periphery of the second region R2 as viewed from the Z-axis direction.

In addition, according to the above embodiments, the first region R1 has a substantially cylindrical shape as viewed from the Z-axis direction, and the second region R2 and the third region R3 have substantially tubular shape as viewed from the Z-axis direction. The shapes of the regions R1, R2, and R3 can be changed as appropriate. While the above embodiments have been described with reference to three regions set in the holding member 10 (the first region R1, the second region R2, and the third region R3), the third region R3 does not necessarily have to be set in the holding member 10. That is, the third resistive heating element 53 does not necessarily have to be provided inside the holding member 10. In addition, a resistive heating element may be provided inside the holding member 10 in addition to the first resistive heating element 51, the second resistive heating element 52, and the third resistive heating element 53.

In addition, the material of each of the members that constitute the heating device 100 according to the above-described embodiments is only illustrative, and each of the members may be formed of another material. For example, according to the heating device 100 of the above-described embodiments, the holding member 10 and the columnar support member 20 are made of ceramic mainly containing aluminum nitride or alumina. However, at least one of the holding member 10 and the columnar support member 20 may be made of another type of ceramic or a material other than ceramic (for example, a metal such as aluminum or an aluminum alloy).

It should be noted that the method for manufacturing the heating device 100 according to the above-described embodiments is intended to be illustrative only, and various modifications or changes may be made.

What is claimed is:

1. A heating device for heating an object, comprising:
a holding member in a shape of a plate with a first surface and a second surface that are substantially orthogonal to a first direction, the object held on the first surface of the holding member;
a columnar support member having a columnar shape extending in the first direction, the columnar support member joined to the second surface of the holding member;
a first resistive heating element disposed within the holding member throughout a first region of the holding member that, as viewed from the first direction, overlaps the columnar support member and a second region of the holding member that, as viewed from the first direction, is located around an outer periphery of the first region and that does not overlap the columnar support member;

a second resistive heating element disposed within the holding member at a position in the first direction that is closer to the first surface than a position of the first resistive heating element in the first direction and disposed in only the first region; and a third resistive heating element disposed within the holding member at a position in the first direction the same as the position of the first resistive heating element in the first direction and disposed in only a third region of the holding member that, as viewed from the first direction, is located around an outer periphery of the second region, wherein the third resistive heating element does not overlap the first resistive heating element as view from the first direction.

2. A heating device for heating an object, comprising:

a holding member in a shape of a plate with a first surface and a second surface that are substantially orthogonal to a first direction, the object held on the first surface of the holding member;

a columnar support member having a columnar shape extending in the first direction, the columnar support member joined to the second surface of the holding member;

a first resistive heating element disposed within the holding member throughout a first region of the holding member that, as viewed from the first direction, overlaps the columnar support member and a second region of the holding member that, as viewed from the first direction, is located around an outer periphery of the first region and that does not overlap the columnar support member;

a second resistive heating element disposed within the holding member at a position in the first direction that is closer to the first surface than a position of the first resistive heating element in the first direction and disposed in only the first region; and a third resistive heating element disposed within the holding member at a position in the first direction the same as the position of the second resistive heating element in the first direction and disposed in only a third region of the holding member that, as viewed from the first direction, is located around an outer periphery of the second region, wherein the third resistive heating element does not overlap the first resistive heating element as view from the first direction.

* * * * *